US010446319B2

(12) United States Patent
Park et al.

(10) Patent No.: US 10,446,319 B2
(45) Date of Patent: Oct. 15, 2019

(54) MULTILAYER CERAMIC CAPACITOR AND BOARD HAVING THE SAME

(71) Applicant: SAMSUNG ELECTRO-MECHANICS CO., LTD., Suwon-si, Gyeonggi-do (KR)

(72) Inventors: Min Cheol Park, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 5 days.

(21) Appl. No.: 15/183,133

(22) Filed: Jun. 15, 2016

(65) Prior Publication Data

US 2017/0148569 A1 May 25, 2017

(30) Foreign Application Priority Data

Nov. 25, 2015 (KR) ........................ 10-2015-0165709

(51) Int. Cl.

*H01G 4/30* (2006.01)
*H01G 4/005* (2006.01)
*H01G 4/232* (2006.01)
*H05K 1/18* (2006.01)
*H01G 4/012* (2006.01)
*H05K 1/02* (2006.01)
*H05K 1/11* (2006.01)
*H05K 3/34* (2006.01)

(52) U.S. Cl.

CPC ............. *H01G 4/005* (2013.01); *H01G 4/012* (2013.01); *H01G 4/232* (2013.01); *H01G 4/30* (2013.01); *H05K 1/181* (2013.01); *H05K 1/0231* (2013.01); *H05K 1/111* (2013.01); *H05K 3/3431* (2013.01); *H05K 2201/10015* (2013.01)

(58) Field of Classification Search

CPC ........................................................ H01G 4/005
USPC ........................................................ 174/260
See application file for complete search history.

(56) References Cited

U.S. PATENT DOCUMENTS 3,838,320 A * 9/1974 Klein ........................ H01G 4/30 361/272
6,765,781 B2 7/2004 Togashi
2007/0268651 A1 * 11/2007 Takashima ............. H01G 4/012 361/303
2009/0168295 A1 7/2009 Togashi
(Continued)

FOREIGN PATENT DOCUMENTS

KR 10-2009-0073037 A 7/2009
KR 10-2013-0025595 A 3/2013
KR 10-1514532 B1 4/2015

*Primary Examiner* — Stanley Tso
(74) *Attorney, Agent, or Firm* — Morgan, Lewis & Bockius LLP

(57) ABSTRACT

A multilayer ceramic capacitor includes a ceramic body having a plurality of dielectric layers layered in a width direction of the ceramic body, and including an active region including first and second internal electrodes alternately disposed with at least one of the dielectric layers interposed therebetween and an ESR adjustment region including one or more third internal electrodes; and first, second and third external electrodes disposed on a mounting surface of the ceramic body to be spaced apart from each other in a length direction of the ceramic body, and a board having the same.

14 Claims, 13 Drawing Sheets

(56) References Cited

U.S. PATENT DOCUMENTS

| | | | | |
|---|---|---|---|---|
| 2010/0149769 | A1* | 6/2010 | Lee | H01G 2/065 361/768 |
| 2010/0188799 | A1* | 7/2010 | Galvagni | H01G 4/012 361/306.3 |
| 2010/0321860 | A1* | 12/2010 | Osawa | H01G 4/012 361/303 |
| 2012/0162853 | A1* | 6/2012 | Togashi | H01G 4/005 361/301.4 |
| 2013/0058006 | A1* | 3/2013 | Kim | H01G 4/12 361/321.2 |
| 2015/0022946 | A1 | 1/2015 | Park et al. | |
| 2015/0325370 | A1* | 11/2015 | Lee | H01G 4/008 361/275.3 |
| 2017/0148571 | A1* | 5/2017 | Akada | H01G 4/30 |

* cited by examiner

MULTILAYER CERAMIC CAPACITOR AND BOARD HAVING THE SAME

CROSS-REFERENCE TO RELATED APPLICATION

This application claims the benefit of priority to Korean Patent Application No. 10-2015-0165709, filed on Nov. 25, 2015 with the Korean Intellectual Property Office, the entirety of which is incorporated herein by reference.

BACKGROUND

The present disclosure relates to a multilayer ceramic capacitor and a board having the same.

A multilayer ceramic capacitor (MLCC) has advantages including a small size, high capacitance, ease of mounting, and the like.

Multilayer ceramic capacitors may be mounted on the circuit boards of image display devices such as a liquid crystal display (LCD), a plasma display panel (PDP), and those of several types of electronic products such as computers, smartphones, and cellular phones to serve to charge or discharge electricity.

A power supply for a central processing unit (CPU) of a computer may cause voltage noise due to a rapid change in a load current when a low voltage is provided.

Therefore, in the power supply, the multilayer ceramic capacitor may be used for the purpose of decoupling to suppress such voltage noise.

As the operating frequency of the multilayer ceramic capacitor for decoupling has recently increased, however, a lower equivalent series inductance (ESL) value is required.

Furthermore, when an equivalent series resistance (ESR) value of the multilayer ceramic capacitor is lower than a desired level, an impedance peak in a parallel resonance frequency generated due to ESL of the multilayer ceramic capacitor and plane capacitance of a microprocessor package may be increased, and impedance at a series resonance frequency of the multilayer ceramic capacitor may be excessively decreased.

Therefore, ESR characteristics of the multilayer ceramic capacitor for decoupling need to be adjusted so that flat impedance characteristics may be implemented in a power distribution network and power can be supplied in a more stable manner.

One method for adjusting ESR characteristics includes forming external and internal electrodes of materials having high electrical resistance.

In this case, a multilayer ceramic capacitor having high ESR characteristics while maintaining a low ESL structure according to the related art may be provided.

In the case in which the external electrodes are formed of the high resistance material, however, a current concentration phenomenon may occur due to a pin hole phenomenon, which may cause localized heat spots, and in the case in which the internal electrodes are formed of the high resistance material, the material of the internal electrode should be continuously changed for matching with a ceramic material to allow for high capacity.

Recently, mobile terminals such as tablet personal computers (PCs), ultrabooks, or the like have been rapidly developed, and microprocessors have also become small, highly integrated products.

Therefore, an area of the circuit board is reduced, and a mounting space of a decoupling capacitor is also limited.

SUMMARY

An aspect of the present disclosure provides a multilayer ceramic capacitor having increased ESR characteristics while having low ESL characteristics, and a board having the same.

According to an aspect of the present disclosure, a multilayer ceramic capacitor includes a ceramic body having a plurality of dielectric layers layered in a width direction of the ceramic body, and including an active region including a plurality of first and second internal electrodes, alternately disposed with the dielectric layers interposed therebetween and an ESR adjustment region including one or more third internal electrodes; and first to third external electrodes sequentially disposed on a mounting surface of the ceramic body to be spaced apart from each other in a length direction of the ceramic body.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
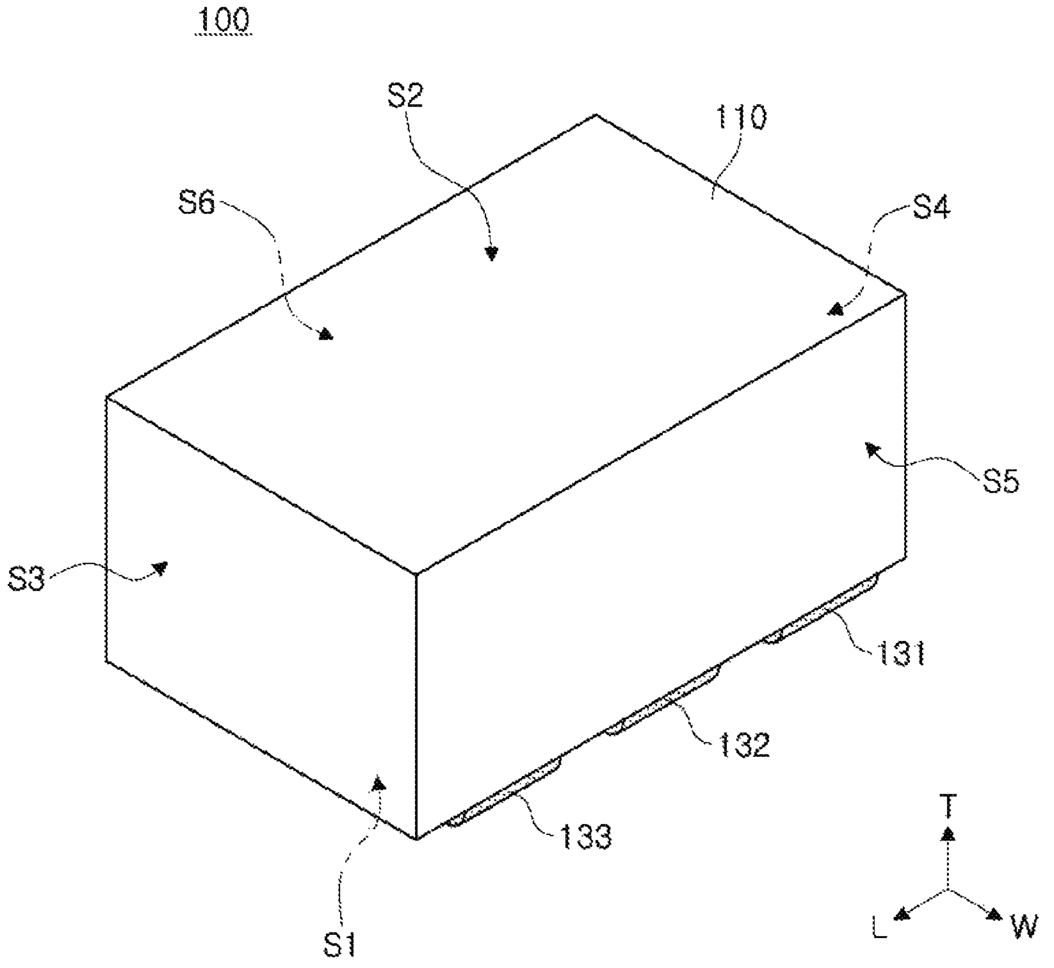
FIG. 1 is a perspective view schematically illustrating a multilayer ceramic capacitor according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Multilayer Ceramic Capacitor

Figure 2:
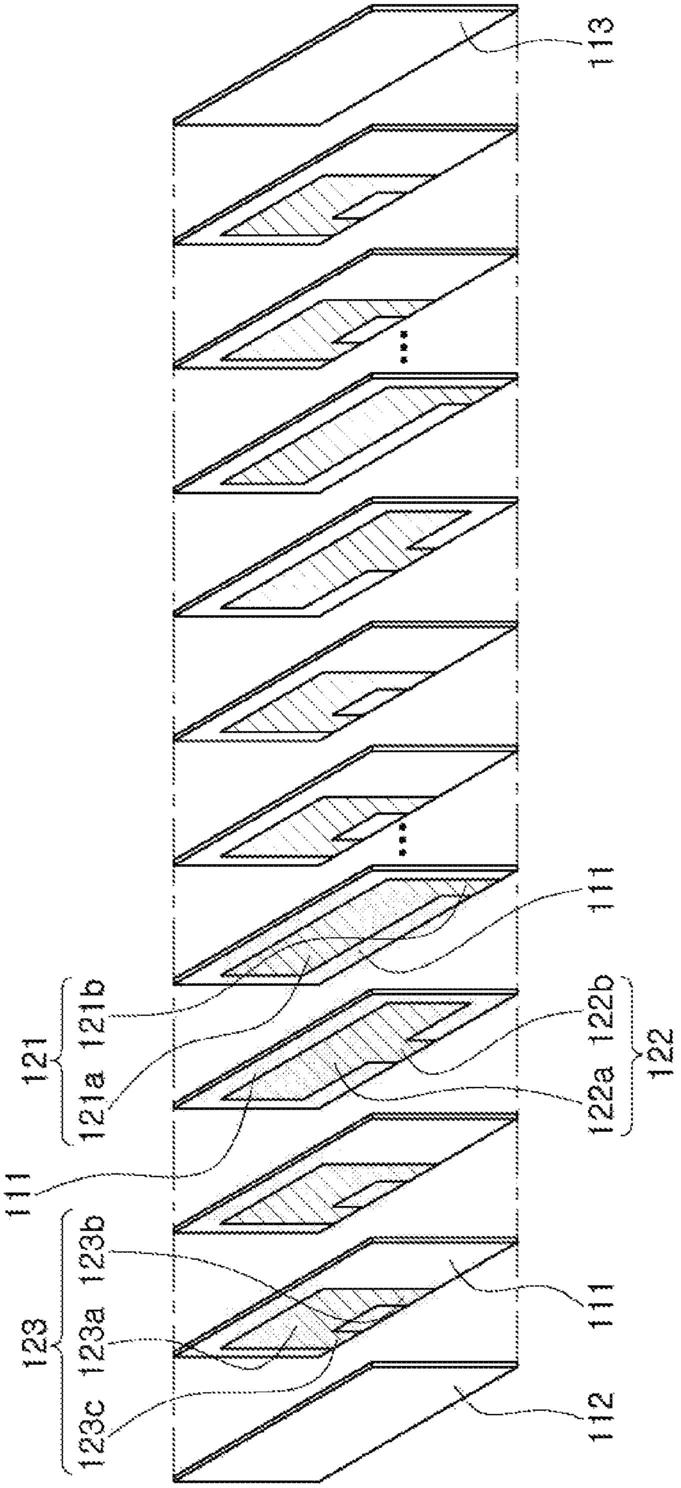
FIG. 2 is an exploded perspective view illustrating a laminated structure of internal electrodes of the multilayer ceramic capacitor of FIG. 1.

FIG. 1 is a perspective view schematically illustrating a multilayer ceramic capacitor according to an exemplary embodiment in the present disclosure and FIG. 2 is an exploded perspective view illustrating a laminated structure of internal electrodes of the multilayer ceramic capacitor of FIG. 1.

Referring to FIGS. 1 and 2, a multilayer ceramic capacitor 100 according to the present exemplary embodiment may include a ceramic body 110 and first to third external electrodes 131, 132 and 133.

The ceramic body 110 may have a plurality of dielectric layers 111 layered in a width direction thereof, and include an active region including a plurality of internal electrodes 121 and 122 and an ESR adjustment region including one or more third internal electrodes 123.

According to the present exemplary embodiment, the multilayer ceramic capacitor 100 may have a structure in which the ESR adjustment region is disposed at the center, the active regions are disposed sequentially on both sides of the ESR adjustment region in the width direction of the ceramic body, and the ESR adjustment regions are again further disposed sequentially on the outside of the left and right active regions in the width direction of the ceramic body.

However, the present disclosure is not limited thereto, and a layout of the active region and the ESR adjustment region may be formed in various combinations as needed. A detailed description thereof will be provided below.

The ceramic body 110 may be formed by stacking the plurality of dielectric layers 111 in the width direction thereof and then sintering the layered dielectric layers 111, and a shape of the ceramic body 110 is not particularly limited, but the ceramic body 110 may have an approximately hexahedral shape as illustrated in FIG. 1.

The ceramic body 110 may have a first surface S1 and a second surface S2 opposing each other in a thickness direction thereof, a third surface S3 and a fourth surface S4 connecting the first surface S1 and the second surface S2 to each other and opposing each other in a length direction thereof, and a fifth surface S5 and a sixth surface S6 opposing each other in a width direction thereof.

Hereinafter, according to the present exemplary embodiment, the description will be made by defining a mounting surface of the multilayer ceramic capacitor 100 as a first main surface S1 of the ceramic body 110.

The plurality of dielectric layers 111, in a sintered state, may be integrated with each other so that boundaries between adjacent dielectric layers are not readily apparent without using a scanning electron microscope (SEM).

Here, a thickness of the dielectric layer 111 may be arbitrarily changed in accordance with a capacitance design of the multilayer ceramic capacitor 100. Preferably, a thickness of one dielectric layer 111 may be 0.01 to 1.00 μm after the sintering. However, the thickness of the dielectric layer 111 is not limited thereto.

In addition, the dielectric layer 111 may contain a ceramic powder having a high dielectric constant, for example, a barium titanate ($BaTiO_3$) based powder, a strontium titanate ($SrTiO_3$) based powder, magnesium titanate, or the like. However, the present disclosure is not limited thereto as long as sufficient capacitance may be obtained.

In addition, the dielectric layer 111 may further contain a ceramic additive, an organic solvent, a plasticizer, a binder, a dispersing agent, and the like, added thereto, if necessary, in addition to the ceramic powder.

The first to third external electrodes 131, 132 and 133 may be sequentially disposed on the first surface S1 of the ceramic body 110 to be spaced apart from each other in the length direction of the ceramic body 110.

In addition, plating layers (not illustrated) may be formed on surfaces of the first to third external electrodes 131, 132 and 133 by performing plating on the surfaces of the first to third external electrodes 131, 132 and 133, if necessary.

Figure 3:
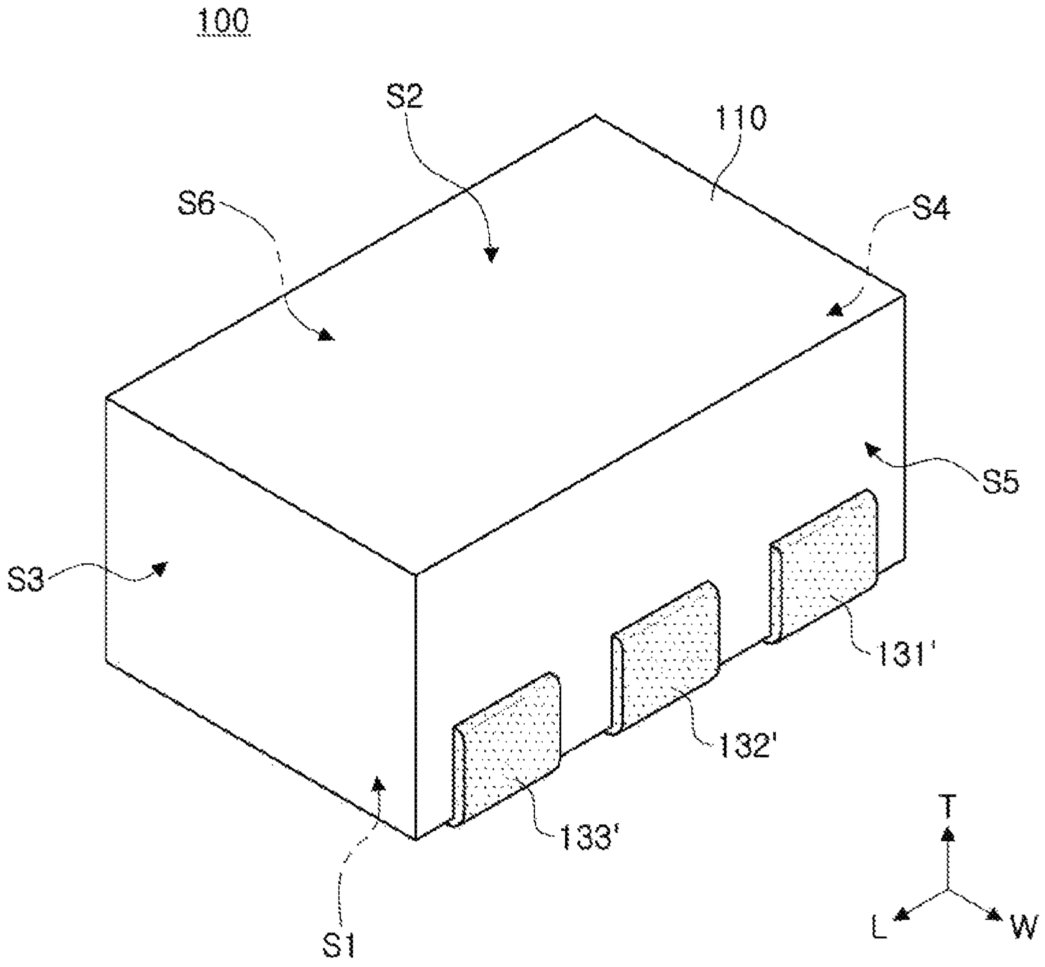
FIG. 3 is a perspective view illustrating another example of external electrodes in the multilayer ceramic capacitor of FIG. 1.

Here, as illustrated in FIG. 3, first to third external electrodes 131', 132' and 133' may have first to third band parts extended from the first surface S1 of the ceramic body 110 to portions of the fifth and sixth surfaces S5 and S6 of the ceramic body 110, thereby improving adhesion strength.

A general multilayer ceramic electronic component may have the external electrodes disposed on both surfaces opposing each other in the length direction of the ceramic body.

In this case, since a current path is elongated at the time of applying an alternating current (AC) voltage to the external electrodes, a current loop may be increased and magnitude of an induced magnetic field is increased, whereby inductance of the electronic component may be increased.

According to the present exemplary embodiment, all of the first to third external electrodes 131, 132 and 133 may be disposed on the first surface S1 of the ceramic body 110. Therefore, the current path is decreased and the current loop is decreased, whereby inductance of the electronic component may be reduced.

The ceramic body 110 may have cover layers 112 and 113 respectively formed in outermost positions of the ceramic body 110 in the width direction thereof as margin parts.

The cover layers 112 and 113 may be formed of the same material as that of the dielectric layer 111 and may have the same configuration as that of the dielectric layer 111 except that they do not include the internal electrodes.

The cover layers 112 and 113 may be formed by each stacking a single dielectric layer or two or more dielectric layers at the outermost of the ceramic body 110 in the width direction thereof, and may serve to prevent damage to the first to third internal electrodes 121, 122 and 123 by physical or chemical stress.

The active layer may be formed by repeatedly stacking the plurality of first and second internal electrodes 121 and 122 in the width direction of the ceramic body with the dielectric layer 111 interposed therebetween.

The first and second internal electrodes 121 and 122, electrodes to which voltages having different polarities are applied, may be formed in the ceramic body 110, and may be disposed to face each other with the dielectric layer 111 interposed therebetween.

Here, the first and second internal electrodes 121 and 122 may be electrically insulated from each other by the dielectric layer 111 disposed therebetween.

The first and second internal electrodes 121 and 122 may be disposed to be spaced apart from the third and fourth surfaces S3 and S4 of the ceramic body 110 by a predetermined distance.

The first and second internal electrodes 121 and 122 may respectively include first and second body parts 121*a* and 122*a* overlapped with adjacent internal electrodes to contribute to capacitance formation, and first and second lead parts 121*b* and 122*b* of which some are extended from the first and second body parts 121*a* and 122*a* and exposed to the first surface S1 of the ceramic body 110.

Thicknesses of the first and second internal electrodes 121 and 122 may be determined depending on a use thereof. For example, the thicknesses of the first and second internal electrodes 121 and 122 may be determined to be in the range of 0.2 to 1.0 μm in consideration of a size of the ceramic body 110, but are not limited thereto.

A material forming the first and second internal electrodes 121 and 122 is not particularly limited, but may be formed using a conductive paste formed of, for example, a noble metal such as palladium (Pd), an palladium-silver (Pd—Ag) alloy, and the like, and at least one of nickel (Ni), and copper (Cu).

As the method of printing the conductive paste, a screen printing method, a gravure printing method, or the like, may be used. However, the present disclosure is not limited thereto.

The first and second lead parts 121*b* and 122*b* may be disposed to be spaced apart from each other in the length direction of the ceramic body 110, and portions exposed through the first surface S1 of the ceramic body 110 may be connected to the first and second external electrodes 131 and 132, respectively, and may be electrically connected thereto.

That is, since the first and second lead parts 121*b* and 122*b* are disposed to be maximally adjacent to each other, ESL of the multilayer ceramic capacitor 100 may be significantly reduced.

The ESR adjustment region may be formed by stacking one or more third internal electrodes 123 in the width direction of the ceramic body 110 with the dielectric layer 111 interposed therebetween.

The third internal electrode 123 may serve to control an ESR value of the multilayer ceramic capacitor 100, and may adjust the layered number of third internal electrodes 123 and a shape thereof to match desired ESR.

Here, the third internal electrode 123 may be disposed to be spaced apart from the third and fourth surfaces S3 and S4 of the ceramic body 110 by a predetermined distance.

The third internal electrode 123 may include a third body part 123*a*, and third and fourth lead parts 123*b* and 123*c* of which portions are extended from the third body part 123*a* and exposed to the first surface S1 of the ceramic body 110.

Here, when viewed in the drawings, the third body part 123*a* may be formed in only a left half degree of the dielectric layer 111 in the length direction thereof, and a length of the third body part 123*a* may be adjusted so that the remaining right half degree of the dielectric layer 111 becomes the margin part.

As an area of the internal electrode is increased, magnitude of ESR implemented by a single layer may be decreased. As in the present exemplary embodiment, if the third body part 123*a* is only formed in a portion connected to the third and fourth lead parts 123*b* and 123*c*, ESR of the third internal electrode 123 may be increased. As a result, a right margin part of the dielectric layer 111 on which the third body part 123*a* is positioned may be larger than a left margin part.

A thickness of the third internal electrode 123 may be determined depending on a use thereof. For example, the thickness of the third internal electrode 123 may be determined to be in the range of 0.2 to 1.0 μm in consideration of a size of the ceramic body 110, but is not limited thereto.

A material forming the third internal electrode 123 is not particularly limited, but may be formed using a conductive paste formed of, for example, a noble metal such as palladium (Pd), a palladium-silver (Pd—Ag) alloy, and the like, and at least one of nickel (Ni) and copper (Cu).

As the method of printing the conductive paste, a screen printing method, a gravure printing method, or the like, may be used. However, the present disclosure is not limited thereto.

The third and fourth lead parts 123*b* and 123*c* may be disposed to be spaced apart from each other in the length direction of the ceramic body 110, and portions exposed through the first surface S1 of the ceramic body 110 may be connected to the second and third external electrodes 132 and 133, respectively, and may be electrically connected thereto.

Figure 4:
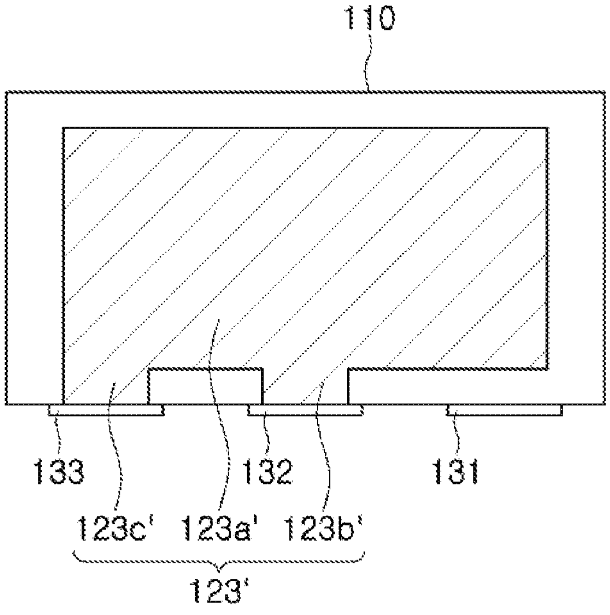
FIG. 4 is a front view illustrating another example of a third internal electrode in the multilayer ceramic capacitor of FIG. 1.

As another example, as illustrated in FIG. 4, a third body part 123*a*' of a third internal electrode 123' may be formed to be longer in the length direction of the ceramic body 110 so that an area overlapped with the first or second body part 121*a* or 122*a* of the first and second internal electrodes 121 and 122 is increased.

Here, the third body part 123*a*' of the third internal electrode 123' is a portion that contributes to capacitance formation in the multilayer ceramic capacitor by forming a capacitor in region overlapped with the first or second body part 121*a* or 122*a*. As such, if the third body part 123*a*' of the third internal electrode 123' is configured, ESR of the multilayer ceramic capacitor may be partially reduced, but capacitance thereof may be increased.

In addition, third and fourth lead parts 123*b*' and 123*c*' may be formed by the same way as the previous example.

MODIFIED EXAMPLE

Figure 5A:
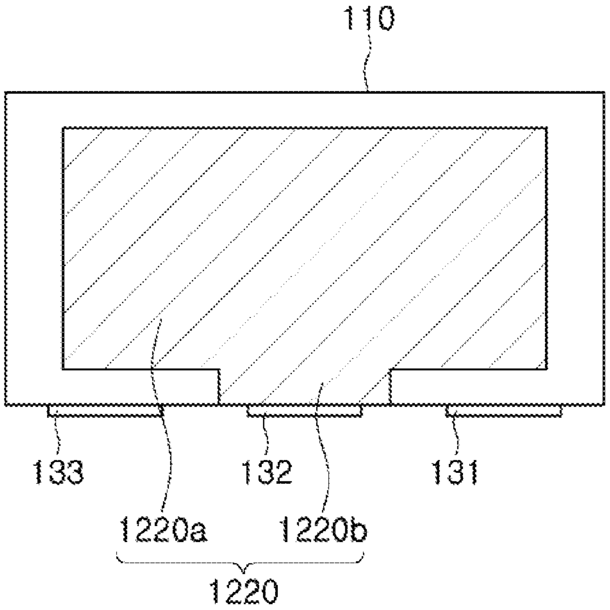
FIGS. 5A and 5B are front views illustrating another example of first and second internal electrodes in the multilayer ceramic capacitor of FIG. 1.
Figure 5B:
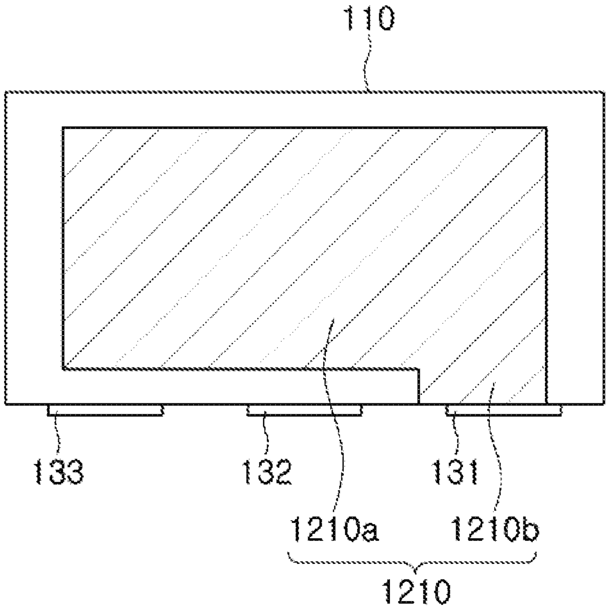
Figure 6:
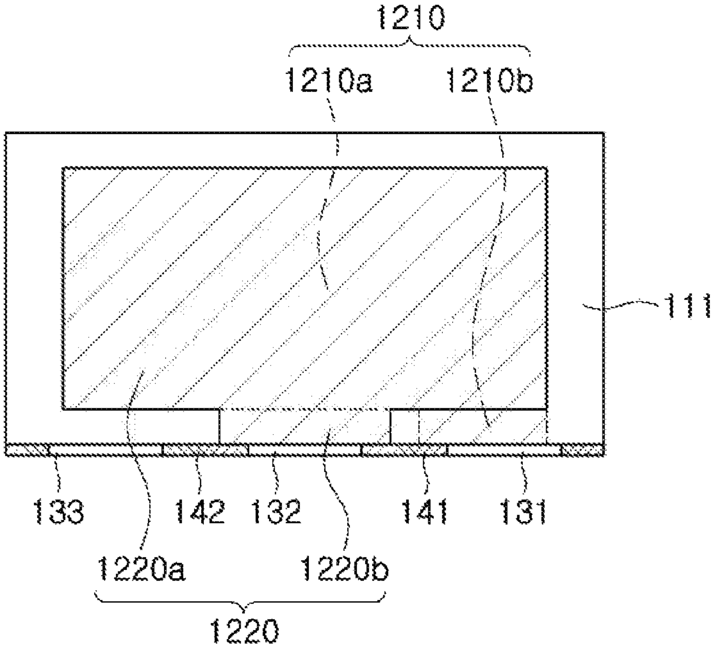
FIG. 6 is a cross-sectional view illustrating the multilayer ceramic capacitor to which the first and second internal electrodes of FIGS. 5A and 5B are applied.

FIGS. 5A and 5B are front views illustrating another example of first and second internal electrodes in the multilayer ceramic capacitor of FIG. 1 and FIG. 6 is a cross-sectional view illustrating the multilayer ceramic capacitor to which the first and second internal electrodes of FIGS. 5A and 5B are applied.

Hereinafter, a detailed description of the same portions as those of the exemplary embodiment described above will be omitted in order to avoid overlapped descriptions, and first and second internal electrodes and an insulating part having a structure different from that of the exemplary embodiment described above will be described in detail.

Referring to FIGS. 5A through 6, a first internal electrode 1210 may include a first body part 1210*a* and a first lead part 1210*b*, and the first lead part 1210*b* may be formed so that a portion of the first lead part 1210*b* is not covered by the first external electrode 131 and is intactly exposed through the first surface S1 of the ceramic body 110 by extending a length of the first lead part 1210*b*.

A second internal electrode 1220 may include a second body part 1220*a* and a second lead part 1220*b*, and the second lead part 1220*b* may be formed so that a portion of the second lead part 1220*b* is not covered by the second external electrode 132 and is intactly exposed through the first surface S1 of the ceramic body 110 by extending a length of the second lead part 1220*b*.

In this case, first and second insulating parts 141 and 142 may be disposed on the first surface S1 of the ceramic body 110 so that the portions of the first and second lead parts 1210*b* and 1220*b*, not covered by the first and second external electrodes 131 and 132 and intactly exposed through the first surface S1 of the ceramic body 110 are covered.

The first insulating part 141 may be disposed between the first and second external electrodes 131 and 132, and the second insulating part 142 may be disposed between the second and third external electrodes 132 and 133.

In this case, the first and second insulating parts 141 and 142 may be formed of, for example, an insulating material such as epoxy, ceramic slurry, or the like, and the material of the first and second insulating parts 141 and 142 is not limited thereto.

Therefore, the first and second internal electrodes 1210 and 1220 maximally increase sizes of the first and second lead parts 1210*b* and 1220*b*, whereby the current path when AC is applied to the external electrodes may be further reduced and the current loop may be further reduced. As a result, magnitude of an induced magnetic field is further reduced, whereby inductance (ESL) of the capacitor may be further reduced.

Figure 7:
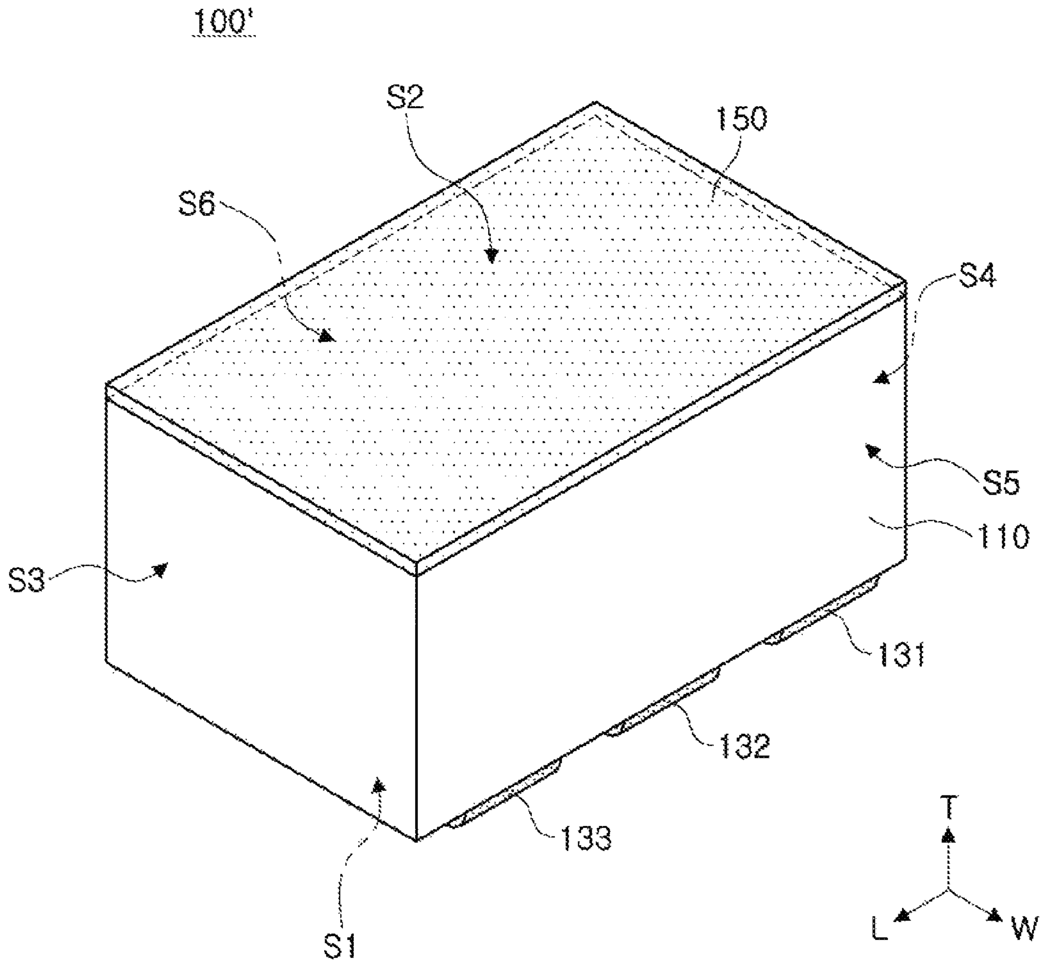
FIG. 7 is a perspective view schematically illustrating a multilayer ceramic capacitor according to another exemplary embodiment in the present disclosure.
Figure 8:
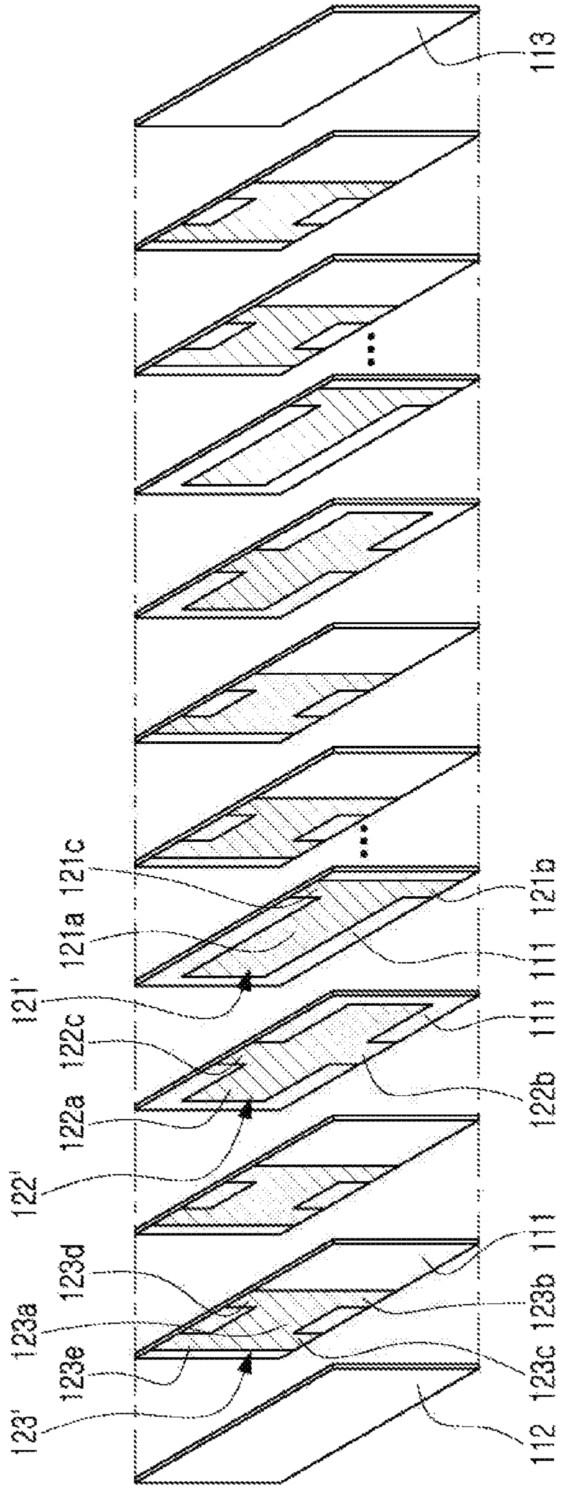
FIG. 8 is an exploded perspective view illustrating a laminated structure of internal electrodes of the multilayer ceramic capacitor of FIG. 7.

FIG. 7 is a perspective view schematically illustrating a multilayer ceramic capacitor according to another exemplary embodiment in the present disclosure and FIG. 8 is an exploded perspective view illustrating a laminated structure of internal electrodes of the multilayer ceramic capacitor of FIG. 7.

Here, a detailed description of the same portions as those of the exemplary embodiment described above will be omitted in order to avoid overlapped descriptions, and internal electrodes and an insulating part having a structure different from that of the exemplary embodiment described above will be described in detail.

Referring to FIGS. 7 and 8, a multilayer ceramic capacitor 100' according to the present exemplary embodiment may have an insulating layer 150 disposed on the second surface S2 opposing the mounting surface of the ceramic body 110.

A first internal electrode 121' may include a fifth lead part 121*c* exposed through the second surface S2 of the ceramic body 110 and connected to the insulating layer 150 formed on the second surface S2 of the ceramic body 110.

A second internal electrode 122' may include a sixth lead part 122*c* exposed through the second surface S2 of the ceramic body 110 and connected to the insulating layer 150 formed on the second surface S2 of the ceramic body 110.

A third internal electrode 123' may include seventh and eighth lead parts 121*d* and 121*e* exposed through the second surface S2 of the ceramic body 110 and connected to the insulating layer 150 formed on the second surface S2 of the ceramic body 110.

Figure 9:
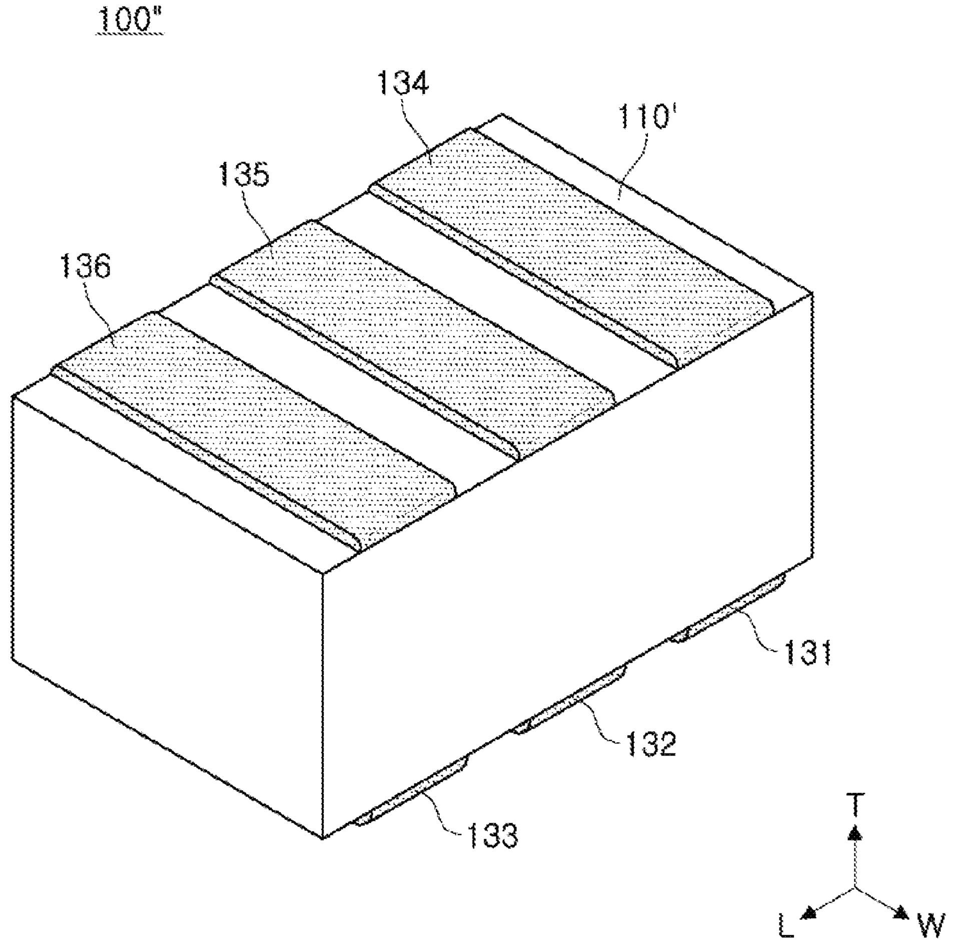
FIG. 9 is a perspective view schematically illustrating a multilayer ceramic capacitor according to another exemplary embodiment in the present disclosure.

FIG. 9 is a perspective view schematically illustrating a multilayer ceramic capacitor according to another exemplary embodiment in the present disclosure.

Here, a detailed description of the same portions as those of the exemplary embodiment described above will be omitted in order to avoid an overlapped description, and internal electrodes and fourth to sixth external electrodes 134, 135 and 136 having a structure different from that of the exemplary embodiment described above will be described in detail. Since a structure of the internal electrode is the same as that of the exemplary embodiment described above, it will be described with reference to FIG. 8.

Referring to FIGS. 8 and 9, a multilayer ceramic capacitor 100" according to the present exemplary embodiment may include fourth to sixth external electrodes 134, 135 and 136 disposed on a second surface S2 of a ceramic body 110' to face the first to third external electrodes 131, 132 and 133, respectively.

The fourth to sixth external electrodes 134, 135 and 136 may be formed to be extended to portions of fifth and sixth surfaces S5 and S6 of the ceramic body 110', if necessary.

A first internal electrode 121' may include a fifth lead part 121*c* exposed through the second surface S2 of the ceramic body 110' and connected to the fourth external electrode 134 formed on the second surface S2 of the ceramic body 110'.

A second internal electrode 122' may include a sixth lead part 122*c* exposed through the second surface S2 of the ceramic body 110' and connected to the fifth external electrode 135 formed on the second surface S2 of the ceramic body 110'.

A third internal electrode 123' may include seventh and eighth lead parts 121*d* and 121*e* exposed through the second surface S2 of the ceramic body 110' and connected to the fifth and sixth external electrodes 135 and 136, respectively, formed on the second surface S2 of the ceramic body 110'.

In addition, the fifth lead part 121*c* may be formed so that a portion thereof is not covered by the fourth external electrode 134 and is intactly exposed through the second surface S2 of the ceramic body 110'.

The sixth lead part 122*c* may be formed so that a portion thereof is not covered by the fifth external electrode 135 and is intactly exposed through the second surface S2 of the ceramic body 110'.

In this case, third and fourth insulating parts (not illustrated) may be each disposed on the second surface S2 of the ceramic body 110' so that the portions of the fifth and sixth lead parts 121*c* and 122*c*, not covered by the fourth and fifth external electrodes 134 and 135 and intactly exposed through the second surface S2 of the ceramic body 110' are covered.

The third insulating part may be disposed between the fourth and fifth external electrodes 134 and 135, and the fourth insulating part may be disposed between the fifth and sixth external electrodes 135 and 136.

The third and fourth insulating parts may be formed of, for example, an insulating material such as epoxy, ceramic slurry, or the like, and the material of the third and fourth insulating parts is not limited thereto.

Therefore, the first and second internal electrodes 121' and 122' maximally increase sizes of the fifth and sixth lead parts 121*c* and 122*c*, whereby the current path when AC is applied to the external electrodes may be further reduced and the current loop may be further reduced. As a result, magnitude of an induced magnetic field is further reduced, whereby inductance (ESL) of the capacitor may be further reduced.

As described above, in a case in which internal and external structures of the multilayer ceramic capacitor 100" is formed in a vertical symmetrical structure, directionality of the capacitor may be removed.

Therefore, since either of the first and second surfaces of the multilayer ceramic capacitor 100" may be provided as the mounting surface, there is an advantage that a direction of the mounting surface at the time of mounting the multilayer ceramic capacitor 100" on the board does not need to be considered.

Board Having Multilayer Ceramic Capacitor

Figure 10:
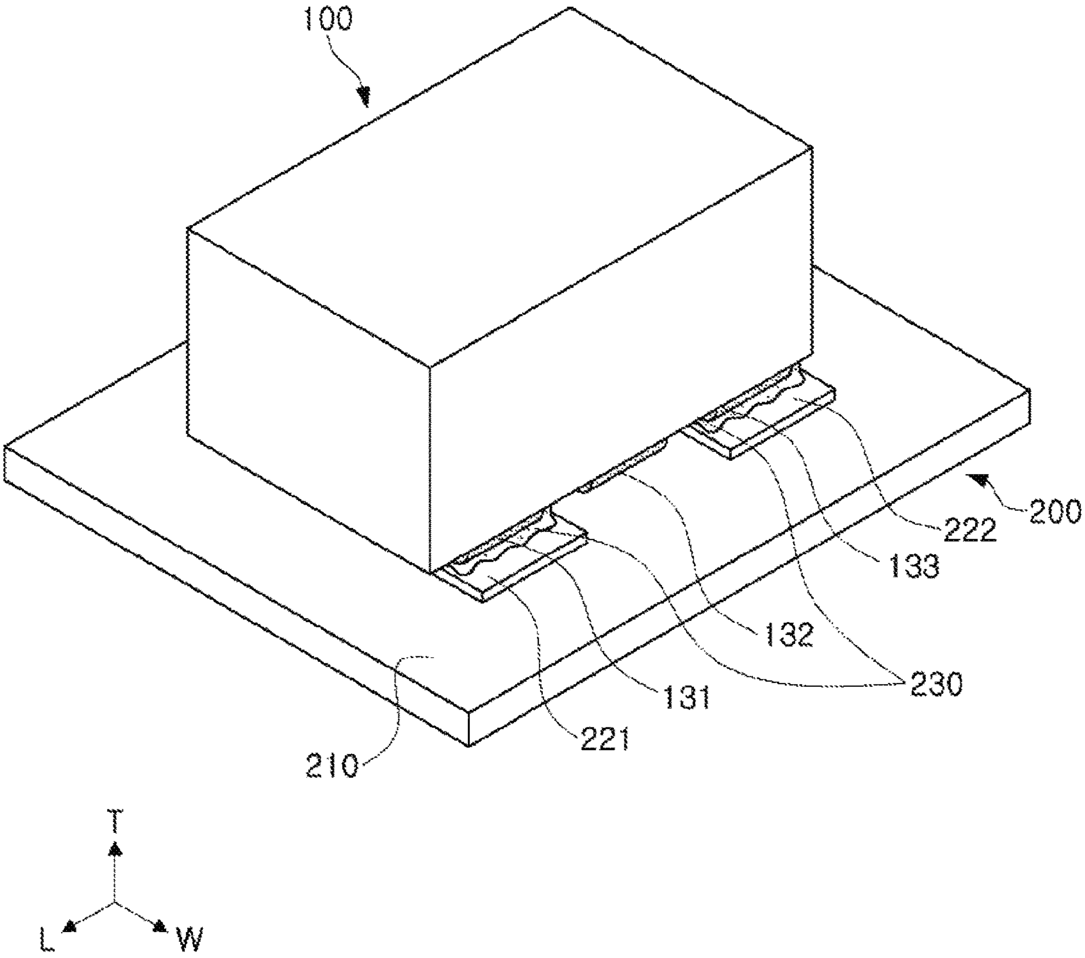
FIG. 10 is a perspective view illustrating the multilayer ceramic capacitor of FIG. 1 mounted on a board.

FIG. 10 is a perspective view illustrating the multilayer ceramic capacitor of FIG. 1 mounted on a board.

Referring to FIG. 10, a board 200 having a multilayer ceramic capacitor according to the present exemplary embodiment may include a substrate 210 on which the multilayer ceramic capacitor 100 is mounted, and first and second electrode pads 221 and 222 formed on an upper surface of the substrate 210 to be spaced apart from each other.

The multilayer ceramic capacitor 100 may be electrically connected to the substrate 210 by soldering 230 in a state in which the first and third external electrodes 131 and 133 are disposed on the first and second electrode pads 221 and 222 to be in contact with each other. Here, the second external electrode 132 may not be connected to the electrode pad of the substrate.

Although the present exemplary embodiment illustrates and describes a case in which the multilayer ceramic capacitor of FIG. 1 is mounted, the present disclosure is not limited thereto. As an example, the multilayer ceramic capacitor illustrated in FIGS. 3, 7, and 9 may also be mounted on the board in a similar structure, thereby configuring the board having the multilayer ceramic capacitor.

Figure 11:
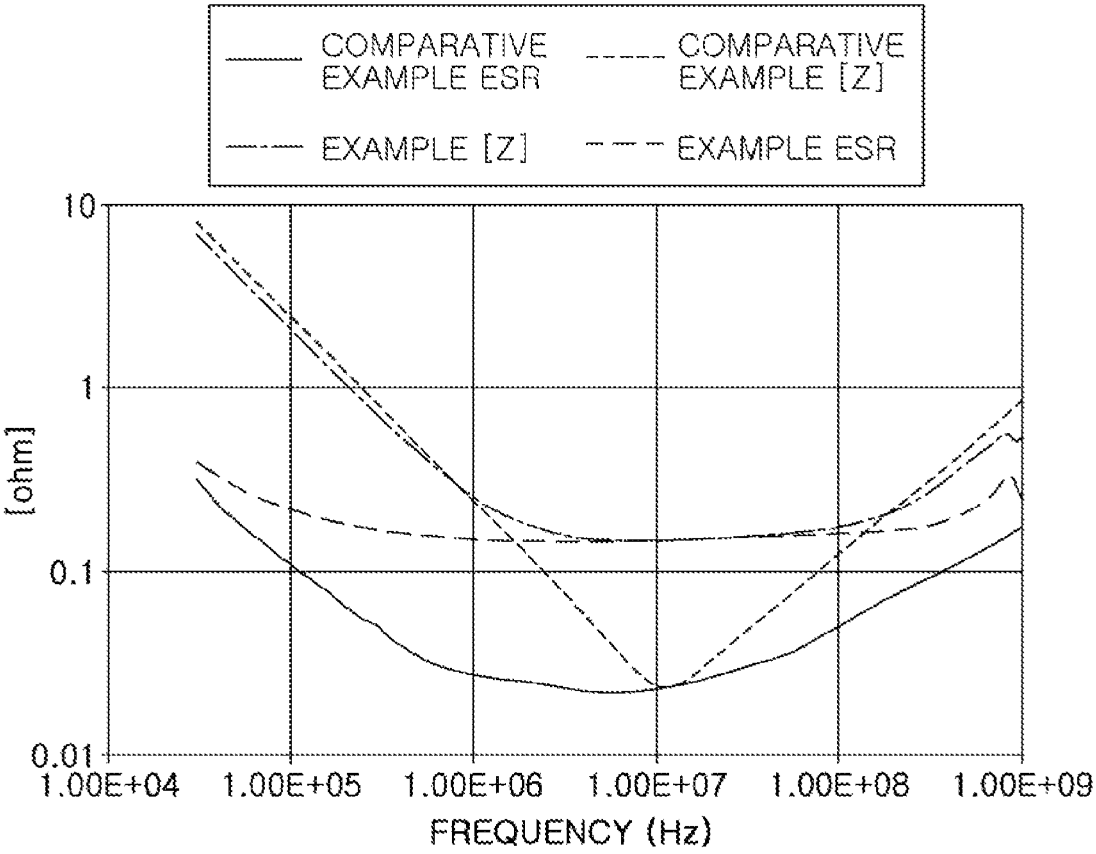
FIG. 11 is a graph illustrating ESR and impedance according to a frequency of the multilayer ceramic capacitor according to the present exemplary embodiment and a comparative example.

FIG. 11 is a graph illustrating ESR and impedance according to a frequency of the multilayer ceramic capacitor according to the present exemplary embodiment and a Comparative Example.

Here, the Example and the Comparative Example relate to a chip of length×width of 1.0×0.5 (mm), and the Comparative Example relates to an MLCC having a general structure in which the external electrodes are formed on both end portions of the ceramic body.

Referring to FIG. 11, in both of the example and the comparative example, an inflection point of equivalent series resistance (ESR) and impedance may occur in at least one region of frequency regions before and after a self resonant frequency (SRF).

However, it may be appreciated that a change in both of ESR and impedance in the example is gently made within a wide frequency band as compared to the Comparative Example. Particularly, in the case of ESR, a small change is shown over the entire frequency and a predetermined level is maintained, whereby an electronic product having high ESR and low ESL may be manufactured.

Figure 12A:
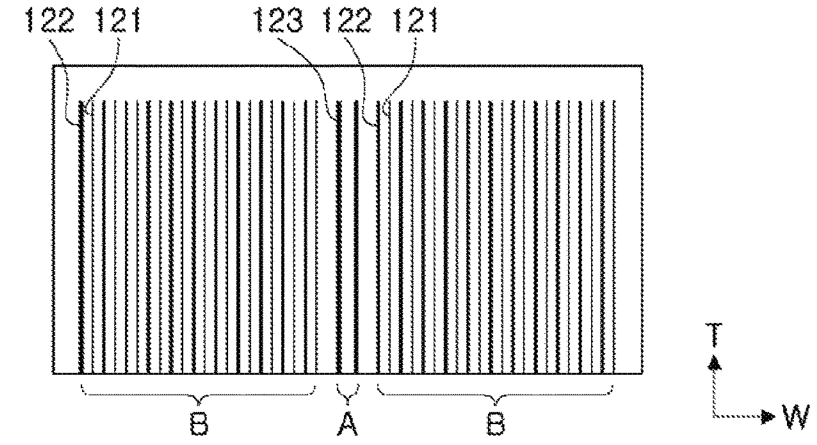
FIGS. 12A through 12C are cross-sectional views respectively illustrating examples in which an ESR adjustment region of the multilayer ceramic capacitor is variously disposed according to several exemplary embodiments in the present disclosure.
Figure 12B:
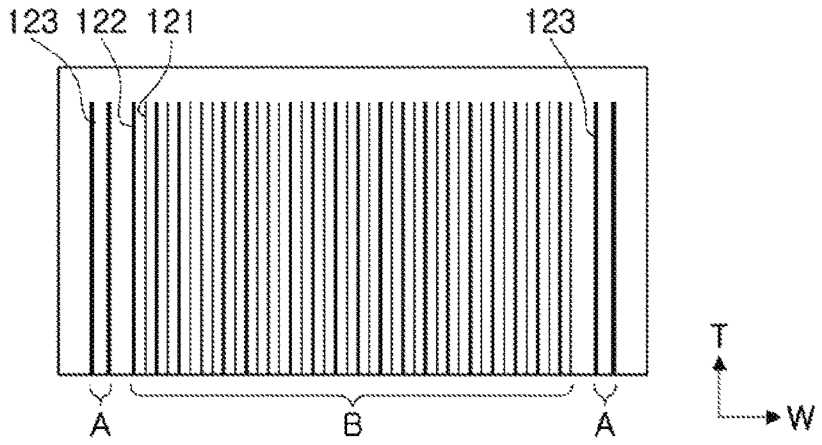
Figure 12C:
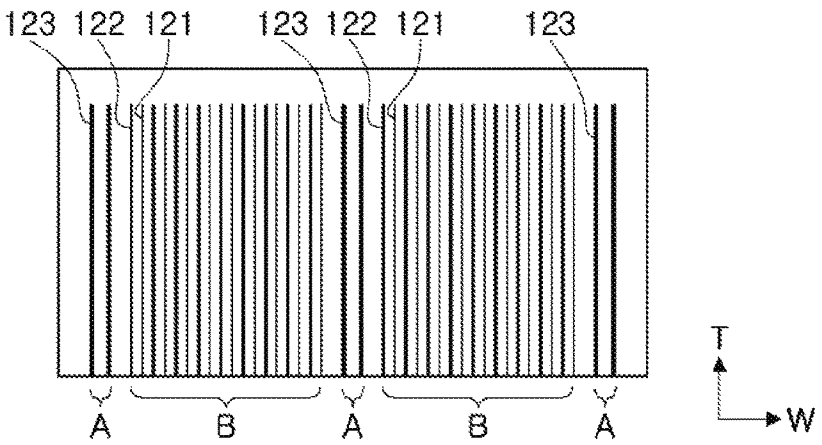
Figure 13:
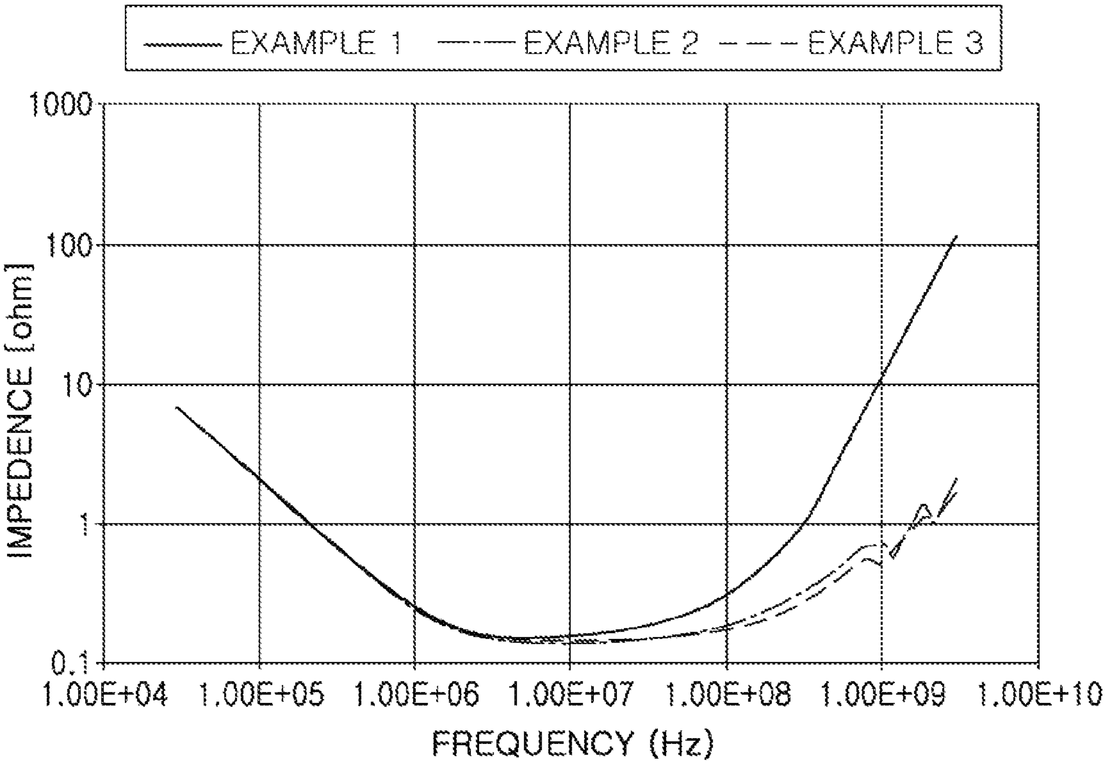
FIG. 13 is a graph illustrating impedance according to frequencies of the respective examples of FIGS. 12A through 12C.

FIGS. 12A through 12C are cross-sectional views illustrating Examples in which an ESR adjustment region of the multilayer ceramic capacitor is variously disposed according to several exemplary embodiments in the present disclosure and FIG. 13 is a graph illustrating impedance according to frequencies of the respective examples of FIGS. 12A through 12C.

FIG. 12A illustrates an Example 1 in which the ceramic body has active regions B disposed sequentially on both sides of an ESR adjustment region A in a width direction of the ceramic body with the ESR adjustment region A interposed therebetween in the width direction of the ceramic body.

FIG. 12B illustrates an Example 2 in which the ceramic body has the ESR adjustment regions A disposed sequentially on both sides of the active region B in the width direction of the ceramic body with the active region B disposed at the center.

FIG. 12C is a structure described above as the exemplary embodiment, and illustrates an Example 3 in which the ESR adjustment region A is disposed at the center, the active regions B are disposed sequentially on both sides of the ESR adjustment region A in the width direction of the ceramic body, and the ESR adjustment regions A are again further disposed sequentially on the outside of the left and right active regions B in the width direction of the ceramic body.

Referring to FIG. 13, it may be appreciated that Examples 1 to 3 do not show a large impedance difference in a low frequency region, and Example 1 shows high impedance characteristics because Example 1 has an ESL value higher than that of Examples 2 and 3 in a high frequency region.

As set forth above, according to exemplary embodiments in the present disclosure, the active region may be configured by the plurality of first and second internal electrodes each having one lead part exposed to the mounting surface of the ceramic body, the ESR adjustment region may be configured by one or more third internal electrodes having two lead parts exposed to the mounting surface of the ceramic body and disposed to be adjacent to each other, and ESR characteristics of the multilayer ceramic capacitor may be adjusted and low ESR characteristics may be significantly increased by adjusting the shape of the third internal electrode and the layered number of third internal electrodes.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:

a ceramic body having dielectric layers layered in a width direction of the ceramic body, and including first and second active regions each including first internal electrodes and second internal electrodes, alternately disposed with at least one of the dielectric layers interposed therebetween, and first to third equivalent series resistance (ESR) adjustment regions each including third internal electrodes; and first, second and third external electrodes sequentially disposed on a mounting surface of the ceramic body to be spaced apart from each other in a length direction of the ceramic body, wherein each of the first internal electrodes includes a first body part and a first lead part extending from the first body part to be exposed to the mounting surface of the ceramic body and electrically connected to the first external electrode;

each of the second internal electrodes includes a second body part and a second lead part extending from the second body part to be exposed to the mounting surface of the ceramic body and electrically connected to the second external electrode;

each of the third internal electrodes includes a third body part and third and fourth lead parts extending from the third body part to be exposed to the mounting surface of the ceramic body and electrically connected to the second and third external electrodes, respectively, each of the first internal electrodes is electrically connected with only the first external electrode among the first to third external electrodes, each of the second internal electrodes is electrically connected with only the second external electrode among the first to third external electrodes, and each of the third internal electrodes is electrically connected with only the second and third external electrodes among the first to third external electrodes, the third internal electrodes in each of the first to third ESR adjustment regions are separated from each other only by the dielectric layers disposed therebetween, the first ESR adjustment region is interposed between the first and second active regions, the first active region is interposed between the first and second ESR adjustment regions, and the second active region is interposed between the first and third ESR adjustment regions.

2. The multilayer ceramic capacitor of claim 1, wherein the first and second lead parts are formed so that having portions thereof are not covered by the first and second external electrodes and exposed to the mounting surface of the ceramic body, and the multilayer ceramic capacitor further includes a first insulating part disposed between the first and second external electrodes and a second insulating part disposed between the second and third external electrodes, on the mounting surface of the ceramic body.

3. The multilayer ceramic capacitor of claim 1, wherein the first, second, and third internal electrodes are disposed to be spaced apart from end surfaces of the ceramic body in the length direction of the ceramic body.

4. The multilayer ceramic capacitor of claim 1, wherein the first, second, and third external electrodes extend from the mounting surface of the ceramic body to portions of side surfaces of the ceramic body in the width direction of the ceramic body.

5. The multilayer ceramic capacitor of claim 1, further comprising:

a fifth lead part extending from the first body part to be exposed to a surface opposing the mounting surface of the ceramic body;

a sixth lead part extending from the second body part to be exposed to the surface opposing the mounting surface of the ceramic body;

seventh and eighth lead parts extending from the third body part to be exposed to the surface opposing the mounting surface of the ceramic body and disposed to be spaced apart from each other in the length direction of the ceramic body; and an insulating layer disposed on the surface opposing the mounting surface of the ceramic body.

6. The multilayer ceramic capacitor of claim 1, further comprising:

fourth, fifth and sixth external electrodes sequentially disposed on a surface opposing the mounting surface of the ceramic body to be spaced apart from each other in the length direction of the ceramic body;

a fifth lead part extending from the first body part to be exposed to the surface opposing the mounting surface of the ceramic body and electrically connected to the fourth external electrode;

a sixth lead part extending from the second body part to be exposed to the surface opposing the mounting surface of the ceramic body and electrically connected to the fifth external electrode; and seventh and eighth lead parts extending from the third body part to be exposed to the surface opposing the mounting surface of the ceramic body and electrically connected to the fifth and sixth external electrodes.

7. The multilayer ceramic capacitor of claim 6, wherein the fifth and sixth lead parts are formed so that portions thereof are not covered by the fourth and fifth external electrodes and exposed to the surface opposing the mounting surface of the ceramic body, and a third insulating part is disposed between the fourth and fifth external electrodes and a fourth insulating part is disposed between the fifth and sixth external electrodes, on the surface opposing the mounting surface of the ceramic body.

8. The multilayer ceramic capacitor of claim 6, wherein the fourth, fifth, and sixth external electrodes are formed to be extended from the surface opposing the mounting surface of the ceramic body to portions of side surfaces of the ceramic body in the width direction of the ceramic body.

9. A board having a multilayer ceramic capacitor, the board comprising:

a substrate having first and second electrode pads formed thereon; and the multilayer ceramic capacitor of claim 1 having first to third external electrodes respectively disposed on the first and second electrode pads.

10. The multilayer ceramic capacitor of claim 1, wherein each third body part of each of the third internal electrodes is spaced apart from a region which overlaps with the first external electrode in a thickness direction of the ceramic body.

11. A multilayer ceramic capacitor comprising:

a ceramic body having a plurality of dielectric layers layered in a width direction of the ceramic body, and including first and second active regions each including first internal electrodes and second internal electrodes, alternately disposed with at least one of the dielectric layers interposed therebetween, such that only one of the first internal electrodes is disposed between two of the second internal electrodes adjacent to each other and only one of the second internal electrodes is disposed between two of the first internal electrodes adjacent to each other, and a first equivalent series resistance (ESR) adjustment region including two or more third internal electrodes; and first, second and third external electrodes sequentially disposed on a mounting surface of the ceramic body to be spaced apart from each other in a length direction of the ceramic body, wherein each of the plurality of first internal electrodes includes a first body part and a first lead part extending from the first body part to be exposed to the mounting surface of the ceramic body and electrically connected to the first external electrode, each of the plurality of second internal electrodes includes a second body part and a second lead part extending from the second body part to be exposed to the mounting surface of the ceramic body and electrically connected to the second external electrode, each of the one or more third internal electrodes includes a third body part and third and fourth lead parts extending from the third body part to be exposed to the mounting surface of the ceramic body and electrically connected to the second and third external electrodes, respectively, the two or more third internal electrodes are separated from each other only by one or more of the dielectric layers, and the first ESR adjustment region is interposed between the first and second active regions in the width direction of the ceramic body.

12. The multilayer ceramic capacitor of claim 11, further comprising second and third ESR adjustment regions, the first active region is disposed between the first ESR adjustment region and the second ESR adjustment region, and the second active region is disposed between the first ESR adjustment region and the third ESR adjustment region.

13. The multilayer ceramic capacitor of claim 11, wherein the first, second, and third external electrodes extend from the mounting surface of the ceramic body to portions of side surfaces of the ceramic body in the width direction of the ceramic body.

14. A multilayer ceramic capacitor comprising:

a ceramic body having a plurality of dielectric layers layered in a width direction of the ceramic body, and including first and second active regions each including a plurality of first and second internal electrodes, alternately disposed with at least one of the dielectric layers interposed therebetween and first to third equivalent series resistance (ESR) adjustment regions each including two or more third internal electrodes; and first, second and third external electrodes sequentially disposed on a mounting surface of the ceramic body to be spaced apart from each other in a length direction of the ceramic body, wherein each of the plurality of first internal electrodes includes a first body part and a first lead part extending from the first body part to be exposed to the mounting surface of the ceramic body and electrically connected to the first external electrode;

each of the plurality of second internal electrodes includes a second body part and a second lead part extending from the second body part to be exposed to the mounting surface of the ceramic body and electrically connected to the second external electrode;

each of the two or more third internal electrodes includes a third body part and third and fourth lead parts extending from the third body part to be exposed to the mounting surface of the ceramic body and electrically connected to the second and third external electrodes, respectively, the two or more third internal electrodes of each of the first to third ESR adjustment regions are separated from each other only by one or more of the dielectric layers, and the first ESR adjustment region is interposed between the first and second active regions, the first active region is disposed between the first ESR adjustment region and the second ESR adjustment region, and the second active region is disposed between the first ESR adjustment region and the third ESR adjustment region.

* * * * *